(12) United States Patent
Yew et al.

(10) Patent No.: US 9,653,391 B1
(45) Date of Patent: May 16, 2017

(54) SEMICONDUCTOR PACKAGING STRUCTURE AND MANUFACTURING METHOD THEREOF

(71) Applicant: TAIWAN SEMICONDUCTOR MANUFACTURING COMPANY LTD., Hsinchu (TW)

(72) Inventors: Ming-Chih Yew, Hsinchu (TW); Kuang-Chun Lee, New Taipei (TW); Po-Yao Lin, Hsinchu County (TW); Shyue-Ter Leu, Hsinchu (TW); Shin-Puu Jeng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/198,286

(22) Filed: Jun. 30, 2016

(51) Int. Cl.
| | | |
|---|---|---|
| *H01L 23/48* | (2006.01) | |
| *H01L 23/52* | (2006.01) | |
| *H01L 29/40* | (2006.01) | |
| *H01L 23/498* | (2006.01) | |
| *H01L 23/31* | (2006.01) | |
| *H01L 21/48* | (2006.01) | |
| *H01L 21/56* | (2006.01) | |

(52) U.S. Cl.
CPC ...... *H01L 23/49816* (2013.01); *H01L 21/486* (2013.01); *H01L 21/4853* (2013.01); *H01L 21/565* (2013.01); *H01L 23/3171* (2013.01); *H01L 23/49827* (2013.01); *H01L 23/49838* (2013.01)

(58) Field of Classification Search
CPC .......... H01L 23/49816; H01L 23/3171; H01L 21/486; H01L 23/49838; H01L 23/49827; H01L 21/565; H01L 21/4853
See application file for complete search history.

(56) References Cited

U.S. PATENT DOCUMENTS

| | | | |
|---|---|---|---|
| 8,341,835 B1 * | 1/2013 | Huemoeller | ........ H01L 21/4857 29/412 |
| 8,361,842 B2 | 1/2013 | Yu et al. | |
| 8,669,140 B1 * | 3/2014 | Muniandy | ............. H01L 21/568 257/774 |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2011/0291288 A1 | 12/2011 | Wu et al. | |

(Continued)

*Primary Examiner* — Thanh Y Tran
(74) *Attorney, Agent, or Firm* — WPAT, P.C., Intellectual Property Attorneys; Anthony King; Kay Yang

(57) ABSTRACT

A semiconductor structure includes a die, a molding interfacing with the die along a first direction, wherein a coefficient of thermal expansion (CTE) mismatch is between the molding and the die, a via extending within and through the molding, an elongated member extending within the molding and at least partially along the first direction, a conductive trace over the elongated member and the die, and a dielectric between the elongated member and the conductive trace, wherein the elongated member is proximal to the die than the via.

20 Claims, 10 Drawing Sheets

(56) References Cited

U.S. PATENT DOCUMENTS

| | | | |
|---|---|---|---|
| 2012/0161315 A1* | 6/2012 | Lin | H01L 23/49816 |
| | | | 257/738 |
| 2012/0273960 A1* | 11/2012 | Park | H01L 21/4846 |
| | | | 257/774 |
| 2012/0286404 A1* | 11/2012 | Pagaila | H01L 21/561 |
| | | | 257/659 |
| 2013/0062760 A1 | 3/2013 | Hung et al. | |
| 2013/0062761 A1 | 3/2013 | Lin et al. | |
| 2013/0075936 A1* | 3/2013 | Lin | H01L 24/19 |
| | | | 257/777 |
| 2013/0119560 A1* | 5/2013 | Toh | H01L 21/6835 |
| | | | 257/774 |
| 2013/0168848 A1 | 7/2013 | Lin et al. | |
| 2013/0264684 A1 | 10/2013 | Yu et al. | |
| 2013/0292846 A1* | 11/2013 | Lee | H01L 23/538 |
| | | | 257/774 |
| 2013/0292851 A1* | 11/2013 | Pagaila | H01L 21/561 |
| | | | 257/774 |
| 2013/0307140 A1 | 11/2013 | Huang et al. | |
| 2014/0103527 A1* | 4/2014 | Marimuthu | H01L 23/3121 |
| | | | 257/737 |
| 2014/0353823 A1* | 12/2014 | Park | H01L 23/3128 |
| | | | 257/737 |
| 2015/0130046 A1* | 5/2015 | Lin | H01L 24/97 |
| | | | 257/712 |

\* cited by examiner

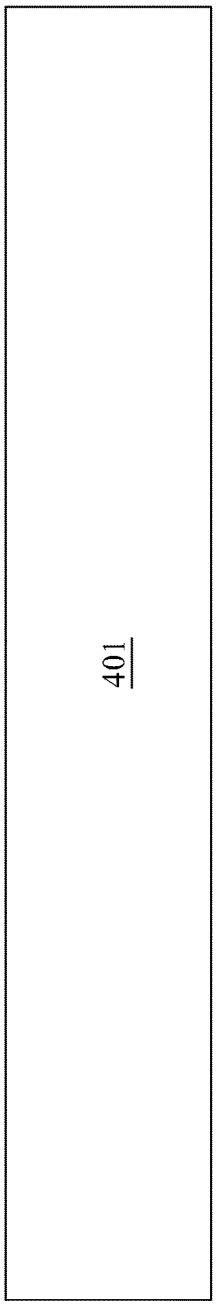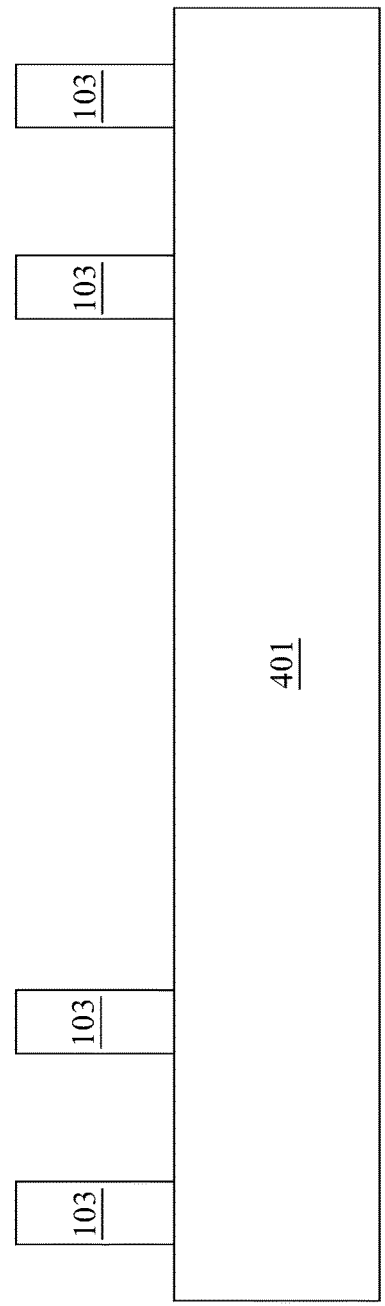

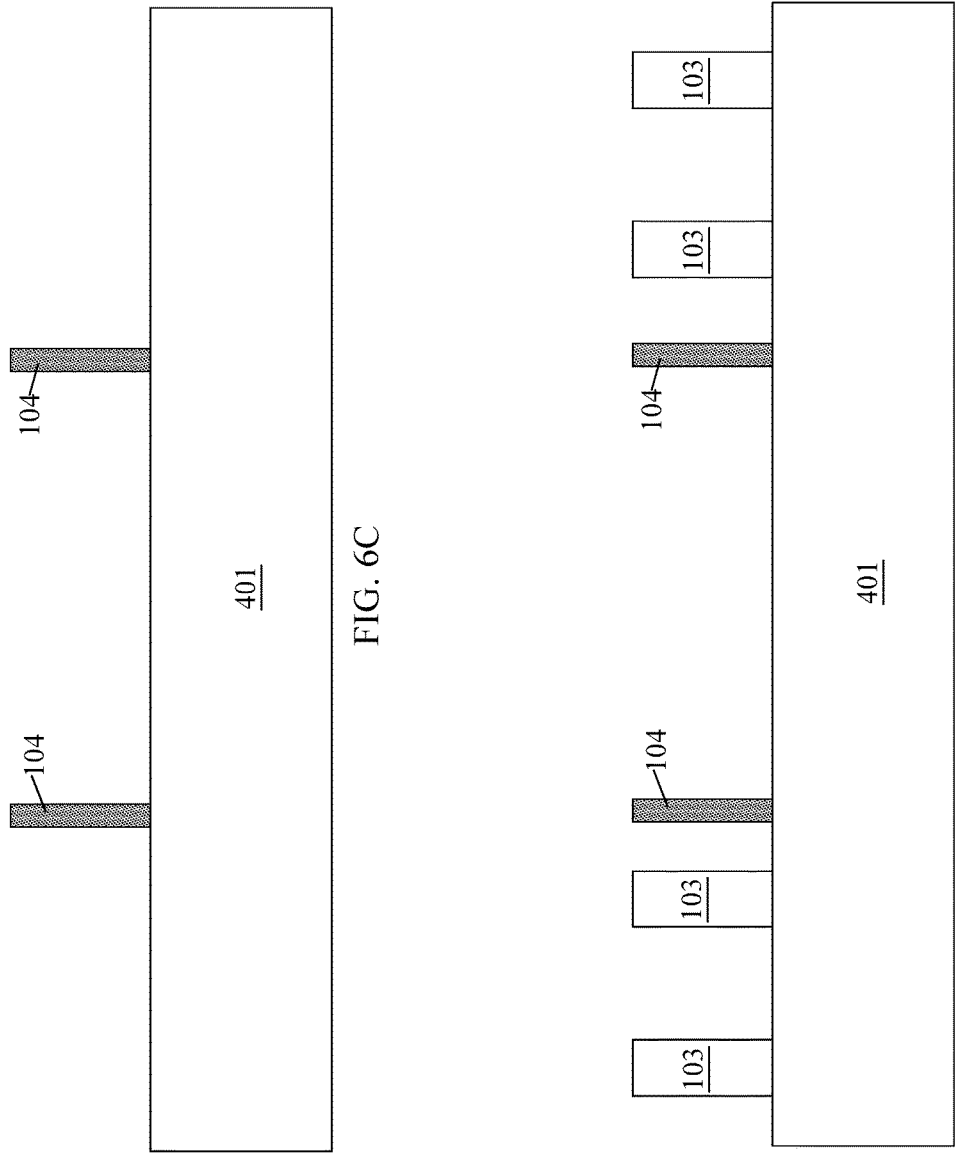

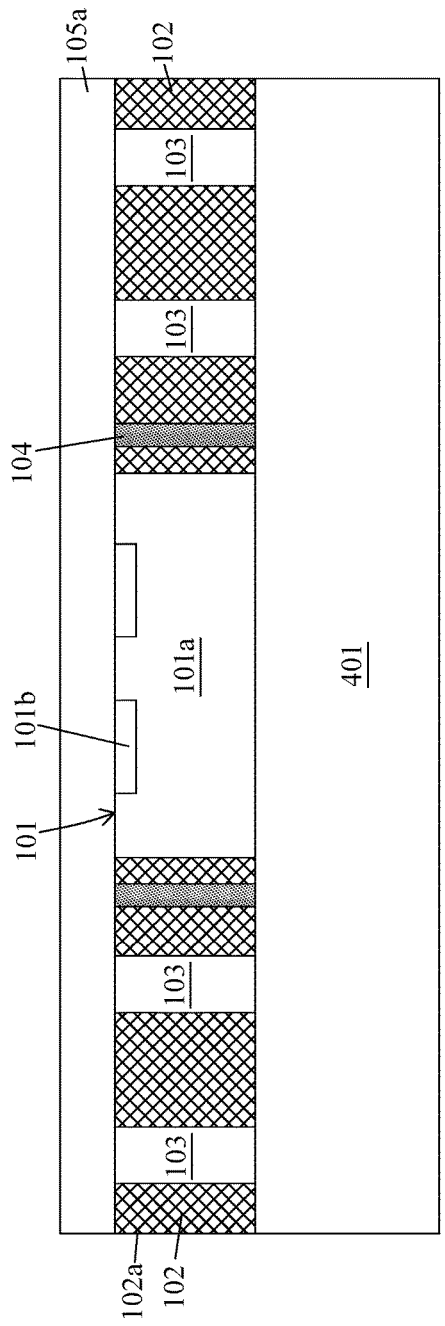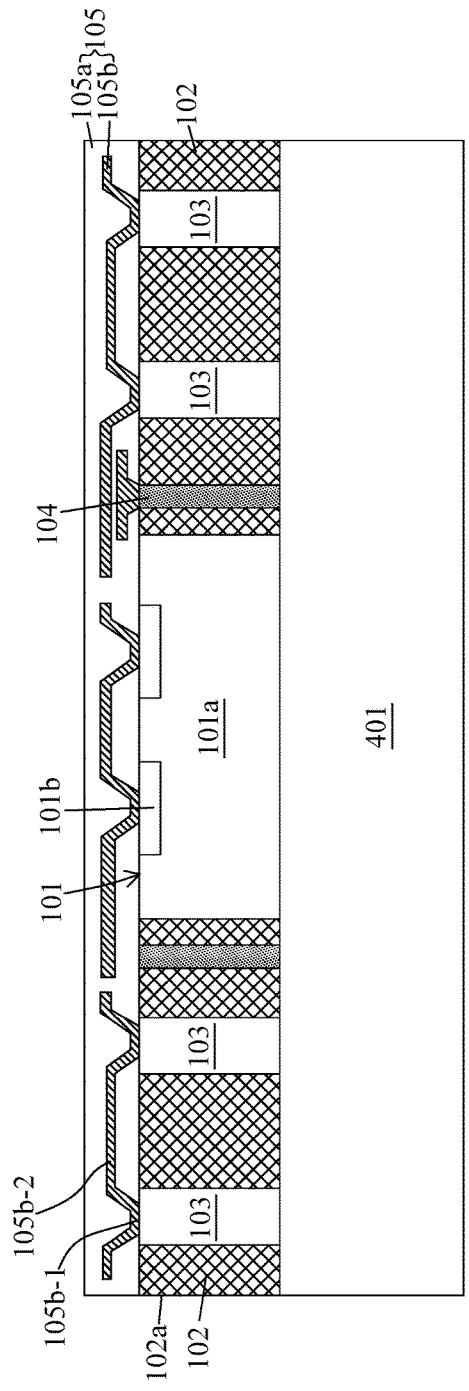
FIG. 6G
FIG. 6H

US 9,653,391 B1

SEMICONDUCTOR PACKAGING STRUCTURE AND MANUFACTURING METHOD THEREOF

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a wafer level packaging (WLP) is widely used for its low cost and relatively simple manufacturing operations. During the WLP operation, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor electrical interconnection, development of cracks, delamination of components, inaccurate placement of components or other issues, resulting in a high yield loss of the semiconductor device. The semiconductor device is produced in an undesired configuration, which would further exacerbate materials wastage and thus increase the manufacturing cost. As such, there are many challenges for modifying a structure of the semiconductor devices and improving the manufacturing operations.

The semiconductor device is assembled with numbers of integrated components including various materials with difference in thermal properties. Since more different components with different materials are involved, a complexity of the manufacturing operations of the semiconductor device is increased. As such, there is a continuous need to improve the manufacturing the semiconductor and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 6A-6L are schematic views of manufacturing a semiconductor structure by a method of FIG. 6 in accordance with some embodiments of the present disclosure.

DETAILED DESCRIPTION OF THE DISCLOSURE

Figure 1:
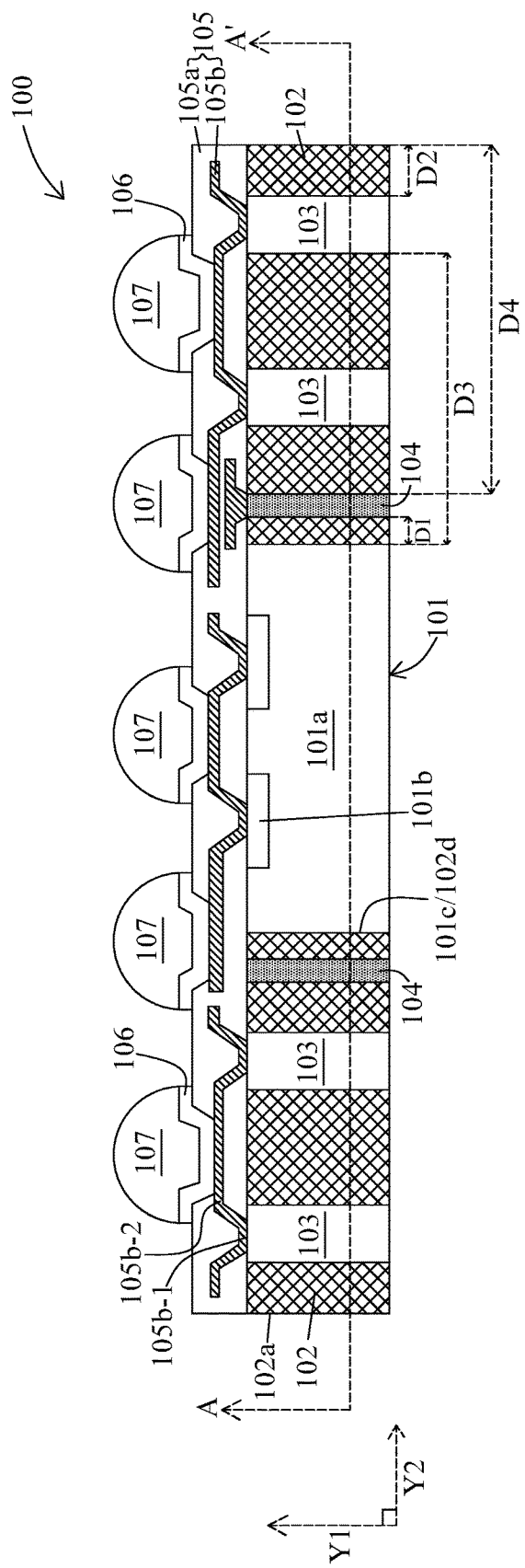
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A die is fabricated and singulated from a semiconductive wafer. After singulation, the die is packaged to become a semiconductor package and integrated with another die or package. The die is encapsulated by a molding, and I/O terminals of the die are routed out through conductive lines disposed within a dielectric layer, and the die is electrically connected to another dies or packages by a via extending through the molding. Such configuration of the semiconductor package involves different kinds of materials (e.g. the die, the molding, the dielectric layer, the conductive structures, etc.) with different thermal properties (e.g. different coefficient of thermal expansion (CTE), etc.). An internal stress would be easily developed between materials during or after thermal processes such as heat treatment, reflowing, etc.

Such a mismatch of CTE would cause crack or warpage developed within the semiconductor package. For example, a stress is developed after several thermal processes, and as a result cracks are developed at where the die, the molding and the dielectric layer interfacing with each other. The cracks can even propagate through the semiconductor package during subsequent manufacturing operations. The propagation of the cracks would further weaken configuration of the semiconductor package and the electrical connection between the dies and the conductive lines, and ultimately results in failure of the semiconductor package.

In the present disclosure, a semiconductor structure with improvement is disclosed. The semiconductor structure includes a die, a molding, a redistribution layer (RDL)

disposed over the die and the molding, and an elongated member disposed adjacent to a corner of the die and extending within the molding. The elongated member is configured to reduce a stress or warpage caused by CTE mismatch between the die, the molding and the RDL. As such, development of crack can be minimized or prevented, and a reliability of the semiconductor structure is improved.

Figures 2, 3:
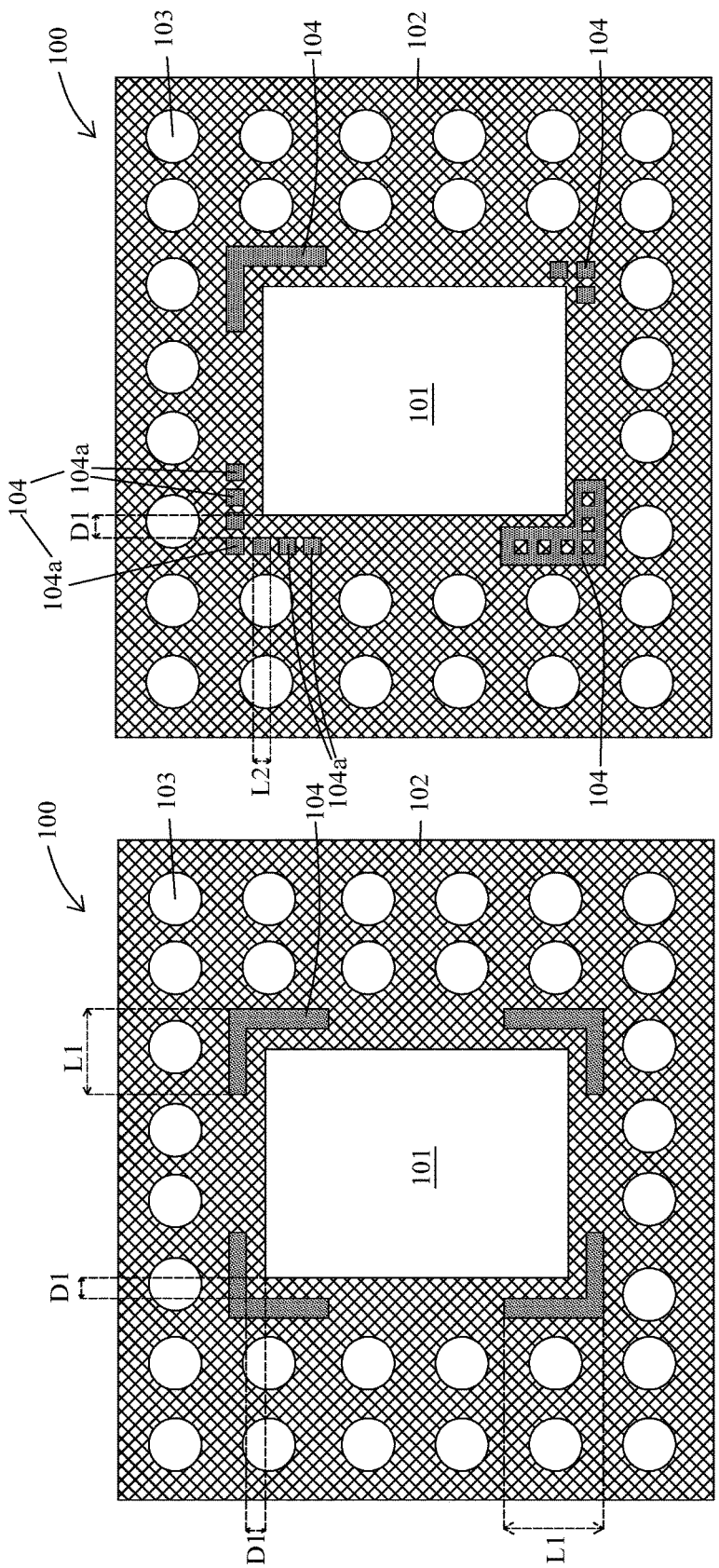
FIG. 2 is a schematic top cross sectional view of the semiconductor structure of FIG. 1 along AA' in accordance with some embodiments of the present disclosure.
FIG. 3 is a schematic top cross sectional view of the semiconductor structure of FIG. 1 along AA' in accordance with some embodiments of the present disclosure.

FIG. 1 is a schematic cross sectional view of a semiconductor structure 100 in accordance with various embodiments of the present disclosure. FIGS. 2 and 3 are schematic top views of the semiconductor structure 100 along AA'. In some embodiments, the semiconductor structure 100 includes a die 101, a molding 102, a via 103, an elongated member 104 and a redistribution layer (RDL) 105. FIGS. 2 and 3 illustrate the elongated member 104 in various shapes or configurations. In some embodiments, the semiconductor structure 100 is a semiconductor package. In some embodiments, the semiconductor structure 100 is an integrated fan out (InFO) package, that I/O terminals of the die 101 are fanned out and redistributed over a surface of the die 101 in a greater area.

In some embodiments, the die 101 is fabricated with a predetermined functional circuit within the die 101 produced by photolithography operations. In some embodiments, the die 101 is singulated from a semiconductive wafer by a mechanical or laser blade. In some embodiments, the die 101 comprises a variety of electrical circuits suitable for a particular application. In some embodiments, the electrical circuits include various devices such as transistors, capacitors, resistors, diodes and/or the like. In some embodiments, the die 101 comprises of any one of various known types of semiconductor devices such as memories (such as SRAMS, flash memories, etc.), microprocessors, application-specific integrated circuits (ASICs), digital signal processors (DSPs), or the like. In some embodiments, the die 101 is a logic device die, central computing unit (CPU) die, transceiver die, or the like. In some embodiments, the die 101 is a system on chip (SOC) that integrates all electronic components into a single die.

In some embodiments, the die 101 has a top cross section (a cross section from the top view of the semiconductor structure 100 as shown in FIG. 2) in a quadrilateral, a rectangular or a square shape. FIG. 1 illustrates the semiconductor structure 100 includes one die, however it is understood that the semiconductor structure 100 can include more than one dies. It is not intended to limit a number of dies in the semiconductor structure 100.

In some embodiments, the die 101 includes a die substrate 101a and a die pad 101b disposed over the die substrate 101a. In some embodiments, the die substrate 101a includes semiconductive materials such as silicon. In some embodiments, the die substrate 101a includes several circuitries and electrical components disposed thereon. In some embodiments, the die pad 101b is disposed over or within a surface of the die substrate 101a. In some embodiments, the die pad 101b is disposed over an active side of the die substrate 101a. In some embodiments, the die pad 101b is electrically connected to a circuitry external to the die 101, such that a circuitry of the die 101 is electrically connected to the circuitry external to the die 101 through the die pad 101b. In some embodiments, the die pad 101b is configured to electrically couple with a conductive trace or a conductive structure. In some embodiments, the die pad 101b includes gold, silver, copper, nickel, tungsten, aluminum, palladium and/or alloys thereof. FIG. 1 illustrates only two die pads 101b over the die substrate 101a for clarity and simplicity, however, an ordinarily skilled person in the art would readily understand that one or more die pads 101b can be present over the die substrate 101a.

In some embodiments, the molding 102 encapsulates the die 101. In some embodiments, the molding 102 is interfaced with the die 101 along a first direction Y1. In some embodiments, a sidewall 101c of the die 101, a sidewall 102a of the molding 102 or an interior sidewall 102d of the molding 102 is parallel to the first direction Y1. In some embodiments, the sidewall 101c of the die 101 is interfaced with the interior sidewall 102d of the molding 102 internal to the semiconductor structure 100. In some embodiments, the sidewall 101c of the die 101 is common with the interior sidewall 102d of the molding 102. In some embodiments, the molding 102 can be a single layer film or a composite stack. In some embodiments, the molding 102 includes various materials, such as molding compound, molding underfill, epoxy, resin, or the like. In some embodiments, the molding 102 has a high thermal conductivity, a low moisture absorption rate and a high flexural strength. In some embodiments, a coefficient of thermal expansion (CTE) mismatch is between the die 101 and the molding 102. In some embodiments, a CTE of the die 101 is substantially different from a CTE of the molding 102. In some embodiments, the CTE of the molding 102 is substantially greater than the CTE of the die 101.

In some embodiments, the via 103 is surrounded by the molding 102. In some embodiments, the via 103 extends within or through the molding 102. In some embodiments, the via 103 extends along the first direction Y1. In some embodiments, a portion of the via 103 is exposed from the molding 102 and is configured to electrically connect to a conductive trace or a conductive structure. In some embodiments, some of the molding 102 fills a space between the die 101 and the via 103. In some embodiments, the via 103 is disposed away from the die 101 or the sidewall 101c of the die 101. In some embodiments, the via 103 is disposed proximal to the sidewall 102a of the molding 102. In some embodiments, a distance D2 between the sidewall 102a of the molding 102 and the via 103 is substantially less than a distance D3 between the sidewall 101c of the die 101 and the via 103. In some embodiments, the distance D3 is substantially greater than about 300 um. In some embodiments, a height of the via 103 along the first direction Y1 is substantially same as a thickness of the molding 102 along the first direction Y1.

In some embodiments, the via 103 includes conductive material such as gold, silver, copper, nickel, tungsten, aluminum, tin and/or alloys thereof. In some embodiments, a cross section of the via 103 along a direction Y2 orthogonal to the first direction Y1 (from the top view of the semiconductor structure 100 as shown in FIG. 2) is in a circular, quadrilateral or polygonal shape. In some embodiments, a width or diameter of the cross section of the via 103 is substantially less than about 200 um. In some embodiments, the width or diameter of the cross section of the via 103 is about 100 um to about 180 um. In some embodiments, an area of the cross section of the via 103 is substantially less than about 30,000 $um^2$. In some embodiments, the via 103 is a through integrated fan out via (TIV) extending through the molding 102. FIG. 1 illustrates only four vias 103 for clarity and simplicity, however, an ordinarily skilled person in the art would readily understand that more vias 103 can be present in the semiconductor structure 100.

In some embodiments, the elongated member 104 extends within the molding 102 and at least partially along the first direction Y1. In some embodiments, the elongated member 104 is disposed between the die and the via 103. In some embodiments, the elongated member 104 is disposed adjacent to a corner of the die 101. In some embodiments, the elongated member 104 extends along a direction of the sidewall 101c of the die 101. In some embodiments, a portion of the elongated member 104 is exposed from the molding 102 and is configured to electrically connect to a conductive trace or a conductive structure. In some embodiments, some of the molding 102 fills a space between the die 101 and the elongated member 104. In some embodiments, the elongated member 104 is a stiffener for stiffening or supporting the semiconductor structure 100. In some embodiments, the stiffener can increase a resistance to a stress or force over or within the semiconductor structure 100. For example, the stiffener can resist a warpage within the semiconductor structure 100 caused by CTE mismatch between the die 101 and the molding 102. In some embodiments, the stiffener can withstand a stress or force to reinforce the semiconductor structure 100. In some embodiments, the elongated member 104 is configured to reduce stress developed within semiconductor structure 100. In some embodiments, the elongated member 104 is configured to reduce warpage caused by CTE mismatch between the die 101 and the molding 102. In some embodiments, the elongated member 104 is configured to connect to an electrical ground. FIG. 1 illustrates only two elongated members 104 for clarity and simplicity, however, an ordinarily skilled person in the art would readily understand that more through elongated members 104 in various shapes or configurations can be present in the semiconductor structure 100.

In some embodiments, the elongated member 104 is disposed proximal to the die 101 than the via 103. In some embodiments, the elongated member 104 is disposed proximal to the die 101 or the sidewall 101c of the die 101. In some embodiments, the elongated member 104 is disposed distal to the sidewall 102a of the molding 102. In some embodiments, a distance D1 between the die 101 and the elongated member 104 is substantially less than a distance D4 between the sidewall 102a of the molding 102 and the elongated member 104. In some embodiments, the distance D1 between the sidewall 101c of the die 101 and the elongated member 104 is substantially less than a distance D4 between the sidewall 102a of the molding 102 and the elongated member 104. In some embodiments, the distance D1 is substantially less than about 300 um. In some embodiments, the distance D1 is about 50 um to about 300 um. In some embodiments, the distance D1 is substantially less than about 50 um. In some embodiments, the distance D1 is about 100 um. In some embodiments, a height of the elongated member 104 along the first direction Y1 is substantially same as or less than the thickness of the molding 102 along the first direction Y1.

In some embodiments, the elongated member 104 includes a material less elastic than the molding 102. In some embodiments, a Young's modulus of the elongated member 104 is substantially greater than a Young's modulus of the molding 104. In some embodiments, the elongated member 104 includes metal, copper, silicon, glass, ceramic or etc. In some embodiments, a cross section of the elongated member 104 along a direction Y2 orthogonal to the first direction Y1 (from the top view of the semiconductor structure 100 as shown in FIG. 2) is in L shape (as shown in FIG. 2), quadrilateral or polygonal shape In some embodiments, the elongated member 104 is a bar or a pillar extending through the molding 102.

Referring to FIG. 2, in some embodiments, a length L1 of the cross section of the elongated member 104 is substantially greater than 180 um. In some embodiments, the length L1 of the elongated member 104 is about 200 um to about 700 um. In some embodiments, the length L1 of the elongated member 104 is about 420 um. In some embodiments, an area of the cross section of the elongated member 104 along the direction Y2 orthogonal to the first direction Y1 is substantially greater than 30,000 $um^2$. In some embodiments, the area of the cross section of the elongated member 104 is substantially about 30,000 $um^2$ to about 500,000 $um^2$. In some embodiments, the area of the cross section of the elongated member 104 is substantially greater than the area of the cross section of the via 103.

Referring to FIG. 3, in some embodiments, the elongated member 104 includes several posts 104a surrounding the corner of the die 101. In some embodiments, the posts 104a are arranged in an L shape to surround the corner of the die 101. In some embodiments, cross sections of the posts 104a have same shapes as or different shapes from each other. In some embodiments, the cross section of the post 104a is in a rectangular, square, quadrilateral, circular, oval, elliptical or polygonal shape. In some embodiments, a length L2 of the post 104a is about 150 um to about 200 um. In some embodiments, the length L2 of the post 104a is about 170 um. In some embodiments, the post 104a is disposed away from the die 101 in the distance D1. In some embodiments, the distance D1 is about 50 um to about 300 um. In some embodiments, a total of the areas of the cross sections of the posts 104a is substantially about 30,000 $um^2$ to about 500,000 $um^2$.

In some embodiments, the elongated member 104 is in a mesh configuration as the elongated member 104 disposed at a lower left corner of the die 101 in FIG. 3. In some embodiments, the elongated member 104 in the mesh configuration is disposed away from the die 101 in the distance D1. In some embodiments, the distance D1 is about 50 um to about 300 um. In some embodiments, an area of the cross section of the elongated member 104 in the mesh configuration is substantially about 30,000 $um^2$ to about 500,000 $um^2$.

Referring back to FIG. 1, in some embodiments, the RDL 105 includes a dielectric 105a and a conductive trace 105b. In some embodiments, the RDL 105 is disposed over the die 101, the molding 102, the via 103 and the elongated member 104. In some embodiments, the RDL 105 is disposed over a surface of the molding 102. In some embodiments, the RDL 105 re-routes a path from the die pad 101b, so as to redistribute I/O terminals of the die 101 over the molding 102.

In some embodiments, the conductive trace 105b is disposed over the elongated member 104, the via 103 or the die 101. In some embodiments, the conductive trace 105b electrically connects to the die 101, the die substrate 101a, the die pad 101b, the via 103 or the elongated member 104. In some embodiments, the conductive trace 105b partially overlaps the elongated member 104 along the direction Y2 orthogonal to the first direction Y1. In some embodiments, the conductive trace 105b includes conductive material such as gold, silver, copper, nickel, tungsten, aluminum, palladium and/or alloys thereof.

In some embodiments, the dielectric 105a is disposed over the die 101, the molding 102, the via 103 and the elongated member 104. In some embodiments, the conductive trace 105b extends within the dielectric 105a. In some embodiments, the conductive trace 105b is surrounded by the dielectric 105a. In some embodiments, the dielectric 105a is disposed between the elongated member 104 and the conductive trace 105b. In some embodiments, the dielectric 105a includes dielectric material such as silicon oxide, silicon nitride, silicon carbide, silicon oxynitride or the like.

In some embodiments, the conductive trace 105b includes a via portion 105b-1 and a land portion 105b-2. In some embodiments, the via portion 105b-1 extends through a portion of the dielectric 105a along the first direction Y1. In some embodiments, the via portion 105b-1 is disposed over and electrically connected to the die pad 101b, the via 103 or the elongated member 104. In some embodiments, the via portion 105b-1 is contacted and electrically connected to a portion of the via 103 exposed from the molding 102 or a portion of the elongated member 104 exposed from the molding 102.

In some embodiments, the land portion 105b-2 is disposed over the die 101, the molding 102, the via 103 or the elongated member 104. In some embodiments, the land portion 105b-2 is electrically connected to the die 101, the via 103 or the elongated member 104 through the via portion 105b-1. In some embodiments, the land portion 105b-2 extends through a portion of the dielectric 105a along the direction Y2 orthogonal to the first direction Y1. In some embodiments, the land portion 105b-2 is configured to receive a conductive line or a conductive structure.

In some embodiments, the semiconductor structure 100 includes a conductive bump 107 disposed over the RDL 105. In some embodiments, the conductive bump 107 is electrically connected to the die 101, the via 103 or the elongated member 104 through the conductive trace 105b. In some embodiments, the land portion 105b-2 is configured to receive the conductive bump 107. In some embodiments, the conductive bump 107 is disposed over the land portion 105b-2. In some embodiments, the conductive bump 107 is contacted with the land portion 105b-2.

In some embodiments, the land portion 105b-2 is configured to receive a bump pad 106 such as under bump metallization (UBM) pad, and the bump pad 106 is configured to receive the conductive bump 107. In some embodiments, the bump pad 106 is disposed over the land portion 105b-2. In some embodiments, the die 101, the via 103 or the elongated member 104 is electrically connected to the conductive bump 107 through the conductive trace 105b and the bump pad 106.

In some embodiments, the conductive bump 107 is configured to electrically connect to a circuitry or a conductive structure. In some embodiments, the conductive bump 107 includes conductive material such as includes solder, copper, nickel, gold or etc. In some embodiments, the conductive bump 107 is a solder ball, a ball grid array (BGA) ball, controlled collapse chip connection (C4) bump, microbump, a pillar or the like. In some embodiments, the conductive bump 107 is in a spherical, hemispherical or cylindrical shape.

Figure 4:
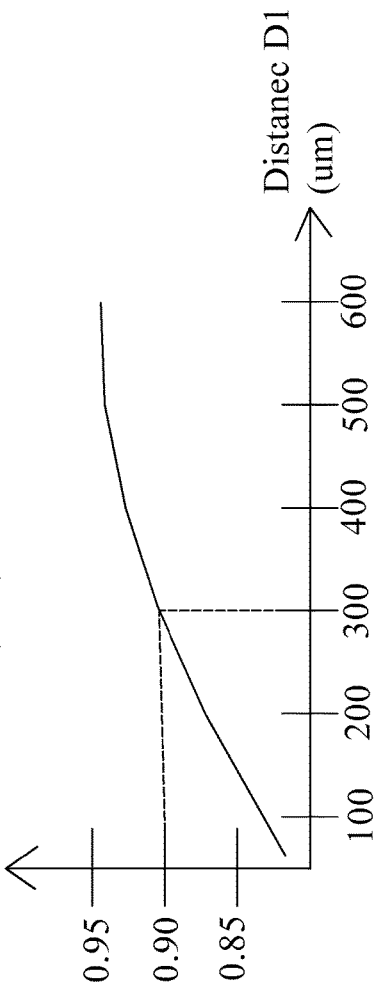
FIG. 4 is a graph showing a relationship between a normalized stress at a corner of a die in the semiconductor structure and a distance D1 between the die and an elongated member.

In some embodiments, a stress is developed within the semiconductor structure 100 during or after several thermal processes due to CTE mismatch between components of the semiconductor structure 100. The stress would result in warpage or cracks within the semiconductor structure 100. Such stress can be reduced by disposing the elongated member 104 adjacent to the corner of the die 101. As such, the warpage or development of cracks can be reduced or prevented. Referring to FIG. 4, a stress within the semiconductor structure 100 is reduced when the elongated member 104 is configured adjacent to the corner of the die 101. In some embodiments as shown in FIG. 4, the stress in the molding 102 and the die 101 is greatly reduced when the distance D1 between the die 101 and the elongated member 104 is less than about 300 um. In some embodiments, the warpage at an area where the die 101, the molding 102 and the RDL 105 interfacing with each other is reduced when the elongated member 104 is disposed adjacent to the corner of the die 101 or disposed less than about 300 um away from the die 101.

Figure 5:
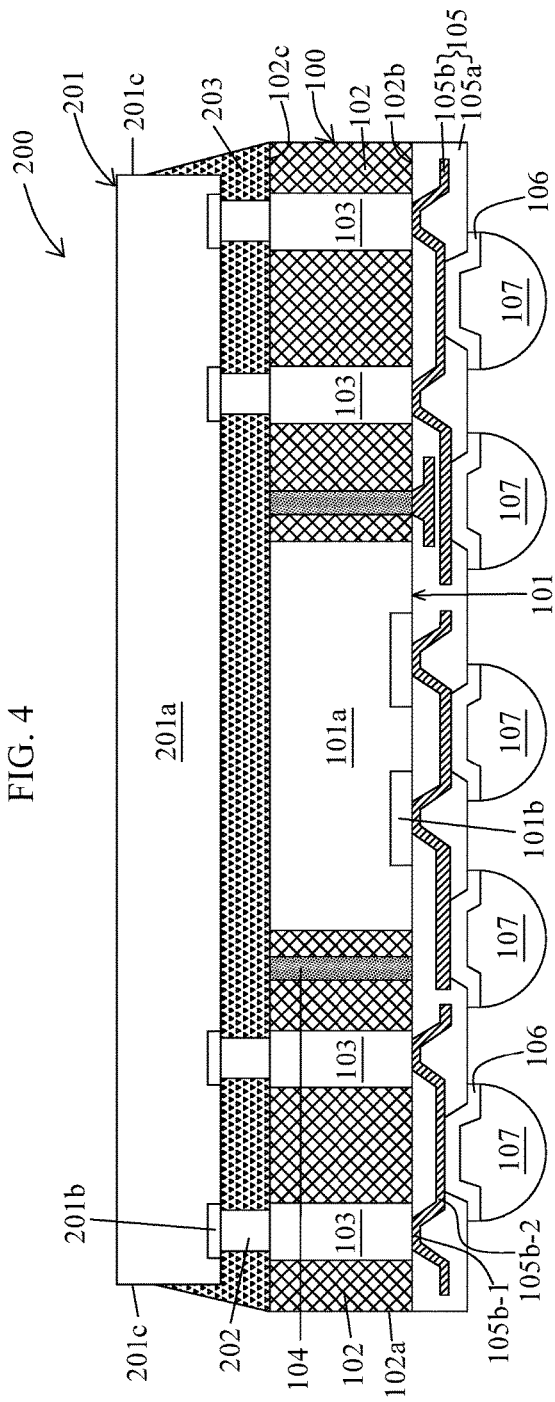
FIG. 5 is a schematic cross sectional view of a semiconductor structure in accordance with some embodiments of the present disclosure.

FIG. 5 is a schematic cross sectional view of a semiconductor structure 200 in accordance with various embodiments of the present disclosure. In some embodiments, the semiconductor structure 200 is integrated fan out (InFO) package or integrated fan out package on package (InFO PoP). In some embodiments, the semiconductor structure 200 includes a second die 201, a connector 202 and the semiconductor structure 100. In some embodiments, the semiconductor structure 100 is flipped, and the second die 201 is disposed over the semiconductor structure 100. In some embodiments, the semiconductor structure 100 has similar configuration as described above or illustrated in any one of FIGS. 1-3.

In some embodiments, the semiconductor structure 100 includes a first die 101, a molding 102, a via 103, an elongated member 104, a RDL 105, a bump pad 106 and a conductive bump 107, which have similar configurations as described above or illustrated in any one of FIGS. 1-3. In some embodiments, the molding 102 encapsulates the first die 101 and includes a first surface 102b and a second surface 102c. In some embodiments, the via 103 extends within and through the molding 102. In some embodiments, the elongated member 104 extends within the molding 102 and disposed between the first die 101 and the via 103. In some embodiments, the elongated member 104 is disposed adjacent to a corner of the first die 101 and disposed proximal to the first die 101 than the via 103. In some embodiments, a dielectric 105a of the RDL 105 is disposed over the first surface 102b of the molding 102. In some embodiments, a conductive trace 105b of the RDL 105 is disposed within the dielectric 105a and electrically connected to the first die 101, the via 103 or the elongated member 104.

In some embodiments, the second die 201 is disposed opposite to the second surface 102c of the molding 102. In some embodiments, the second die 201 is fabricated with a predetermined functional circuit within the second die 201 produced by photolithography operations. In some embodiments, the second die 201 is singulated from a semiconductive wafer by a mechanical or laser blade. In some embodiments, the second die 201 comprises a variety of electrical circuits suitable for a particular application. In some embodiments, the electrical circuits include various devices such as transistors, capacitors, resistors, diodes and/or the like. In some embodiments, the second die 201 is a dynamic random access memory (DRAM). In some embodiments, the conductive trace 105b is electrically connected to the second die 201 through the via 103. In some embodiments, the elongated member 104 is electrically isolated from the second die 201. In some embodiments, the conductive trace 105b connected to the elongated member 104 is electrically isolated from the second die 201. In some embodiments, the elongated member 104 is configured to connect to an electrical ground.

In some embodiments, the second die 201 includes a second die substrate 201a and a second die pad 201b disposed over the second die substrate 201a. In some embodiments, the second die substrate 201a includes semiconductive materials such as silicon. In some embodiments, the second die substrate 201a includes several circuitries and electrical components disposed thereon. In some embodiments, the second die pad 201b is disposed over an active side of the second die substrate 201a. In some embodiments, the second die pad 201b includes gold, silver, copper, nickel, tungsten, aluminum, palladium and/or alloys thereof. In some embodiments, the via 103 is disposed adjacent to a periphery 201 of the second die 201.

In some embodiments, the connector 202 is disposed over the via 103 to electrically connect the first die 101 with the second die 201 through the via 103. In some embodiments, the connector 202 is disposed between the second die pad 201b and a portion of the via 103 exposed from the molding 102. In some embodiments, the connector 202 bonds with the second die pad 201b and the via 103. In some embodiments, the second die 201 is electrically connected to the first die 101 through the second die pad 201b, the connector 202, the via 103 and the conductive trace 105b. In some embodiments, the connector 202 includes conductive material such as includes solder, copper, nickel, gold or etc. In some embodiments, the connector 202 is a conductive pillar, a bump, a solder ball or the like. In some embodiments, the connector 202 is in a spherical, hemispherical or cylindrical shape.

In some embodiments, the semiconductor structure 200 includes an underfill 203 surrounding the periphery 201c of the second die 201 and the connector 202. In some embodiments, the underfill 203 is disposed between the second die 201 and the second surface 102c of the molding 102. In some embodiments, the underfill 203 includes polymer, epoxy, etc.

In some embodiments, the semiconductor structure 200 includes a board disposed opposite to the first surface 102b of the molding 102 and electrically connected to the first die 101 through the conductive bump 107. In some embodiments, the board is a circuit board, a printed circuit board (PCB) or etc. In some embodiments, the board is electrically connected to the first die 101 and the second die 201 through the conductive bump 107, the conductive trace 105b, the via 103 and the connector 202.

Figure 6:
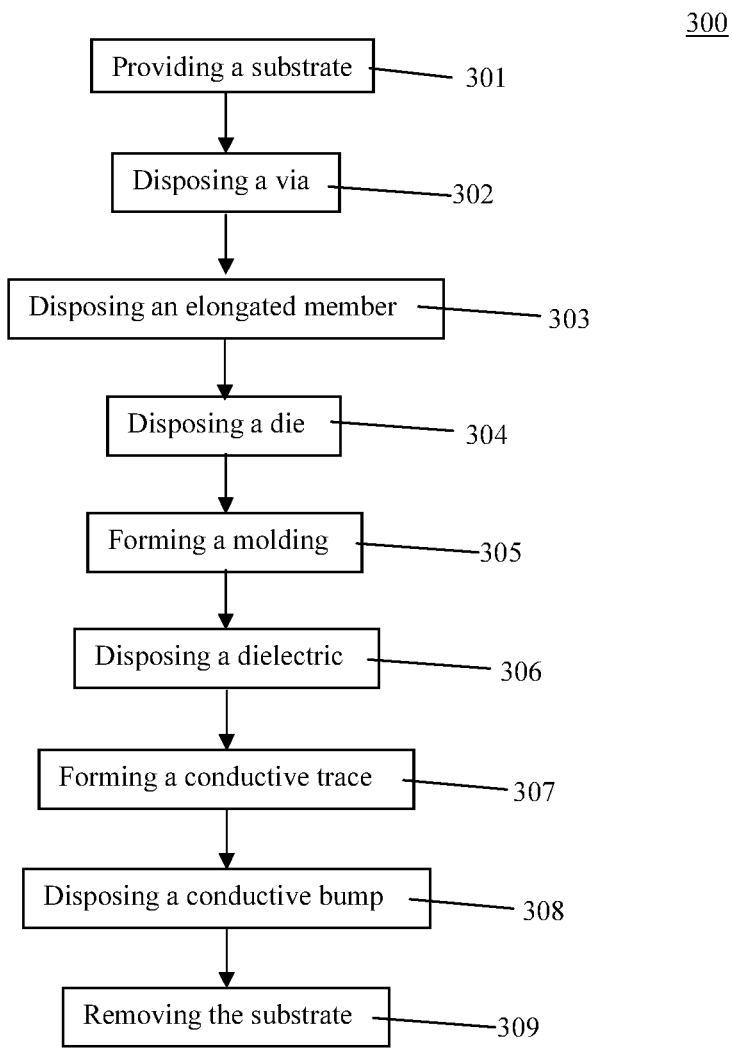
FIG. 6 is a flow diagram of a method of manufacturing a semiconductor structure in accordance with some embodiments of the present disclosure.

In the present disclosure, a method of manufacturing a semiconductor structure 100 is also disclosed. In some embodiments, a semiconductor structure 100 is formed by a method 300. The method 300 includes a number of operations and the description and illustration are not deemed as a limitation as the sequence of the operations. FIG. 6 is an embodiment of the method 300 of manufacturing the semiconductor structure 100. The method 300 includes a number of operations (301, 302, 303, 304, 305, 306, 307, 308 and 309).

In operation 301, a substrate 401 is provided as shown in FIG. 6A. In some embodiments, the substrate 401 is a carrier substrate for temporarily supporting components subsequently disposed thereon. In some embodiments, the substrate 401 is a wafer. In some embodiments, the substrate 401 includes silicon, glass, ceramic or the like.

In operation 302, a via 103 is disposed over the substrate 401 as shown in FIG. 6B. In some embodiments, the via 103 is formed by disposing a photoresist over the substrate 401, patterning the photoresist to include a recess, disposing a conductive material into the recess, and then removing the photoresist from the substrate 401. In some embodiments, the conductive material is disposed by electroplating, electroless plating or other suitable operations. In some embodiments, the conductive material includes gold, silver, copper, nickel, tungsten, aluminum, tin and/or alloys thereof. In some embodiments, the via 103 has similar configuration as described above or illustrated in any one of FIGS. 1-3.

In operation 303, an elongated member 104 is disposed over the substrate 401 as shown in FIG. 6C. In some embodiments, the elongated member 104 is attached on the substrate 401 by an adhesive such as glue, tape, die attach film (DAF), etc. In some embodiments, the elongated member 104 is formed by disposing a photoresist over the substrate 401, patterning the photoresist to include a recess, disposing a material such as metal, silicon, glass, ceramic or etc. into the recess, and then removing the photoresist from the substrate 401. In some embodiments, the elongated member 104 has similar configuration as described above or illustrated in any one of FIGS. 1-3.

In some embodiments, the operation 303 is implemented before the operation 302, that the elongated member 104 is disposed over the substrate 401 before disposing the via 103. In some embodiments, the operation 303 is implemented after the operation 302. In some embodiments, the operation 302 and the operation 303 are implemented simultaneously, that the elongated member 104 and the via 103 are disposed over the substrate 401 simultaneously as shown in FIG. 6D.

Figure 6E:
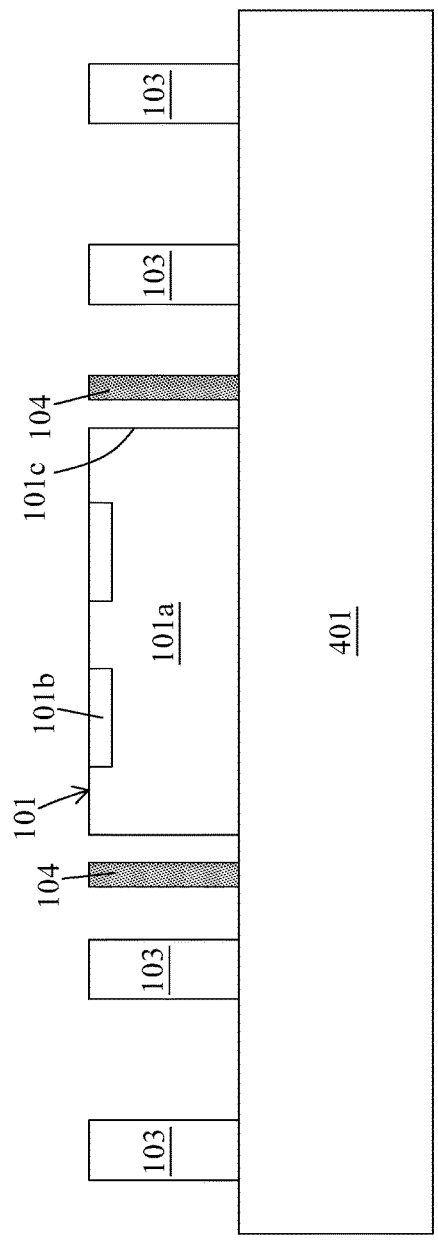

In operation 304, a die 101 is disposed over the substrate 401 as shown in FIG. 6E. In some embodiments, the die 101 is placed on and attached to the substrate 401 by an adhesive such as glue, tape, die attach film (DAF), etc. In some embodiments, the elongated member 104 is disposed between the die 101 and the via 103. In some embodiments, the elongated member 104 is disposed proximal to the die 101 than the via 103. In some embodiments, the die 101 has similar configuration as described above or illustrated in any one of FIGS. 1-3.

Figure 6F:
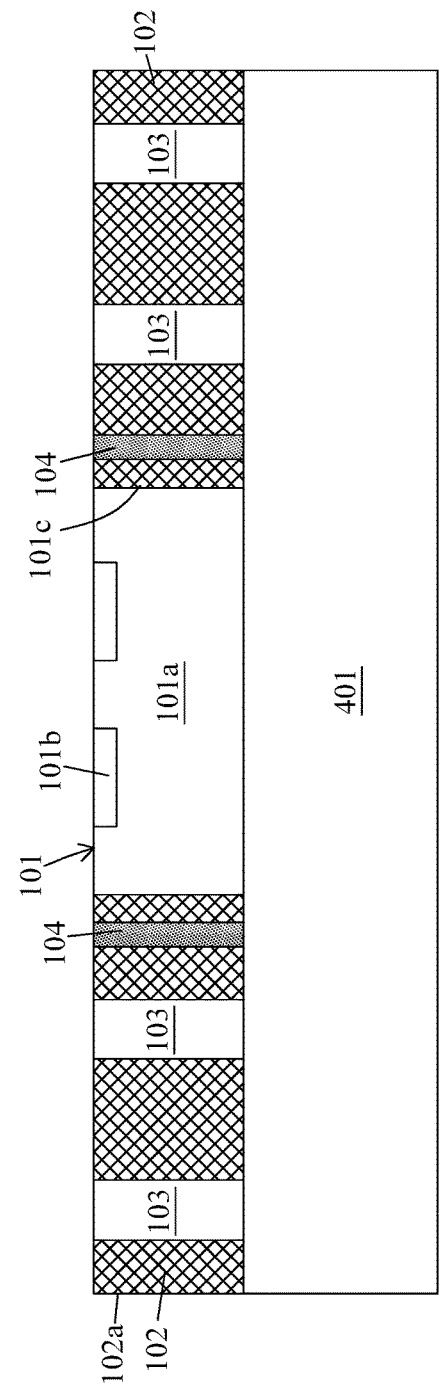

In operation 305, a molding 102 is formed as shown I FIG. 6F. In some embodiments, the molding 102 is disposed over the substrate 401 and surrounds the die 101, the via 103 and the elongated member 104. In some embodiments, the die 101, the via 103 and the elongated member 104 are encapsulated by the molding 102. In some embodiments, the molding 102 is formed by disposing a molding material over the substrate 401, and then grinding the molding material to thin down the molding material until exposing the die 101, the via 103 and the elongated member 104. In some embodiments, the molding 102 is formed by transfer molding, injection molding or any other suitable operations. In some embodiments, the molding 102 has similar configuration as described above or illustrated in any one of FIGS. 1-3.

In operation 306, a dielectric 105a is disposed over the molding 102 as shown in FIG. 6G. In some embodiments, the dielectric 105a is disposed over the die 101, the via 103 and the elongated member 104. In some embodiments, the dielectric 105a is disposed by spin coating, chemical vapor deposition (CVD) or any other suitable operations. In some embodiments, the dielectric 105a is disposed and then patterned by photolithography and etching operations. In some embodiments, a predetermined portion of the dielectric 105a is removed, so as to expose the die pad 101b, the via 103 or the elongated member 104 for subsequent routing operations. In some embodiments, the dielectric 105a has similar configuration as described above or illustrated in any one of FIGS. 1-3.

In operation 307, a conductive trace 105b is formed as shown in FIG. 6H. In some embodiments, the conductive trace 105b is formed within the dielectric 105a. In some embodiments, the conductive trace 105b is formed by disposing a conductive material within the predetermined portion of the dielectric 105b being removed. In some embodiments, the conductive material includes copper, gold, silver, etc. In some embodiments, the conductive trace 105b is disposed by electroplating or other suitable operations. In some embodiments, the conductive trace 105b includes a via portion 105b-1 contacting the die pad 101b, the via 103 or the elongated member 104. In some embodiments, the conductive trace 105b includes a land portion 105b-2 extending horizontally within the dielectric 105a. In some embodiments, the conductive trace 105b has similar configuration as described above or illustrated in any one of FIGS. 1-3.

Figure 6I:
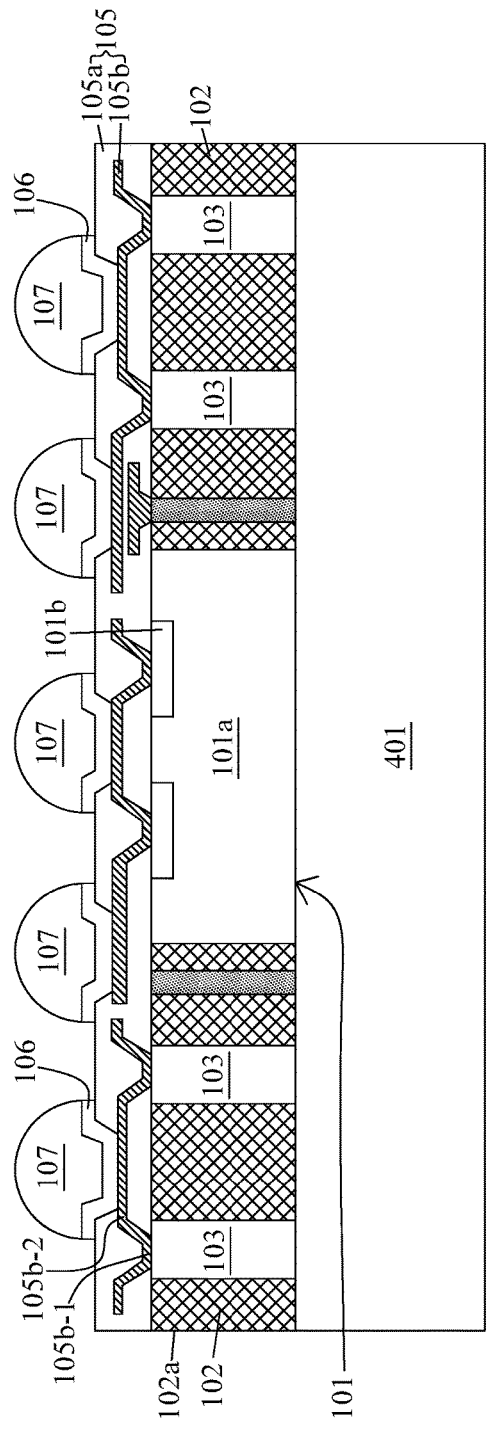

In operation 308, a conductive bump 107 is disposed over the conductive trace 105b as shown in FIG. 6I. In some embodiments, the conductive bump 107 is disposed over the land portion 105b-2 of the conductive trace 105b. In some embodiments, a bump pad 106 is disposed over the land portion 105b-2, and the conductive bump 107 is disposed on the bump pad 106. In some embodiments, the conductive bump 107 is disposed over the land portion 105b-2 or the bump pad 106 by ball dropping, solder pasting, stencil printing or other suitable operations. In some embodiments, the conductive bump 107 has similar configuration as described above or illustrated in any one of FIGS. 1-3.

Figure 6J:
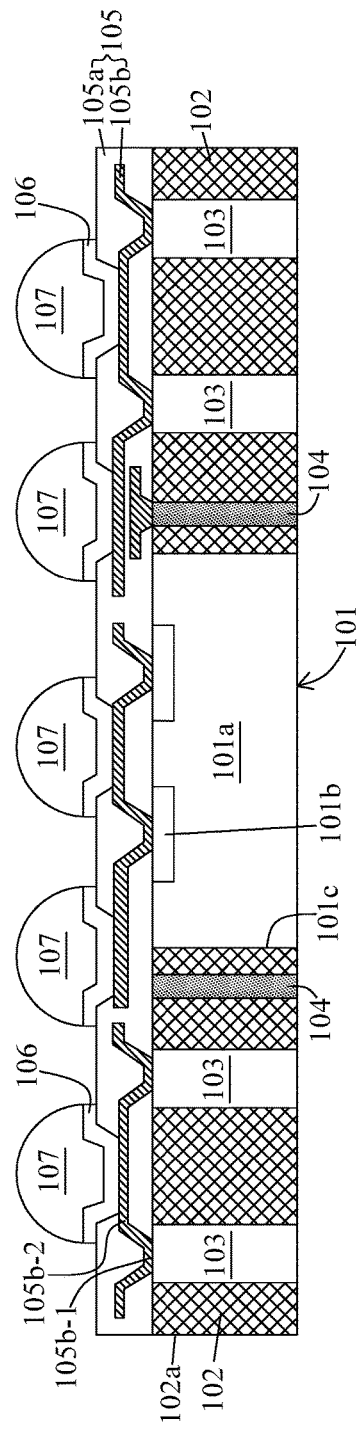

In operation 309, the substrate 401 is removed as shown in FIG. 6J. In some embodiments, the substrate 401 is detached and removed from the die 101, the molding 102, the via 103 and the elongated member 104, and then a semiconductor structure 100 is formed. In some embodiments, the semiconductor structure 100 has similar configuration as described above or illustrated in any one of FIGS. 1-3.

Figure 6K:
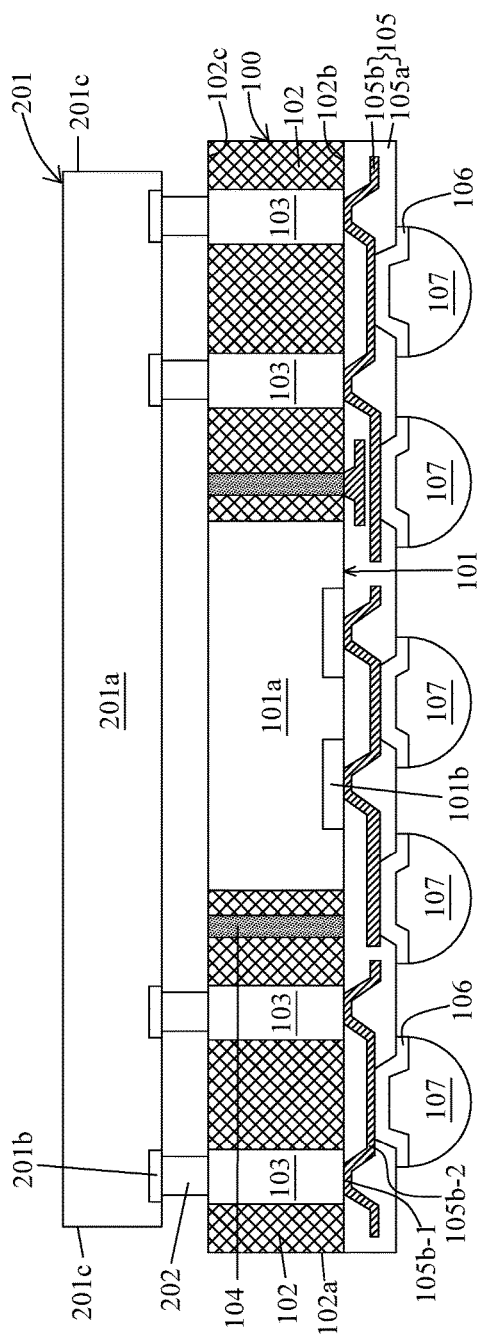

In some embodiments, the semiconductor structure 100 is flipped and bonded with a second die 201 as shown in FIG. 6K after the removal of the substrate 401. In some embodiments, the second die 201 is disposed over and bonded with the semiconductor structure 100 by a connector 202, such that the second die 201 is electrically connected to the first die 101a through the connector 202, the via 103 and the conductive trace 105b. In some embodiments, the connector 202 is disposed over a portion of the via 103 exposed from the molding 102. In some embodiments, the second die 201 has similar configuration as described above or illustrated in FIG. 5.

Figure 6L:
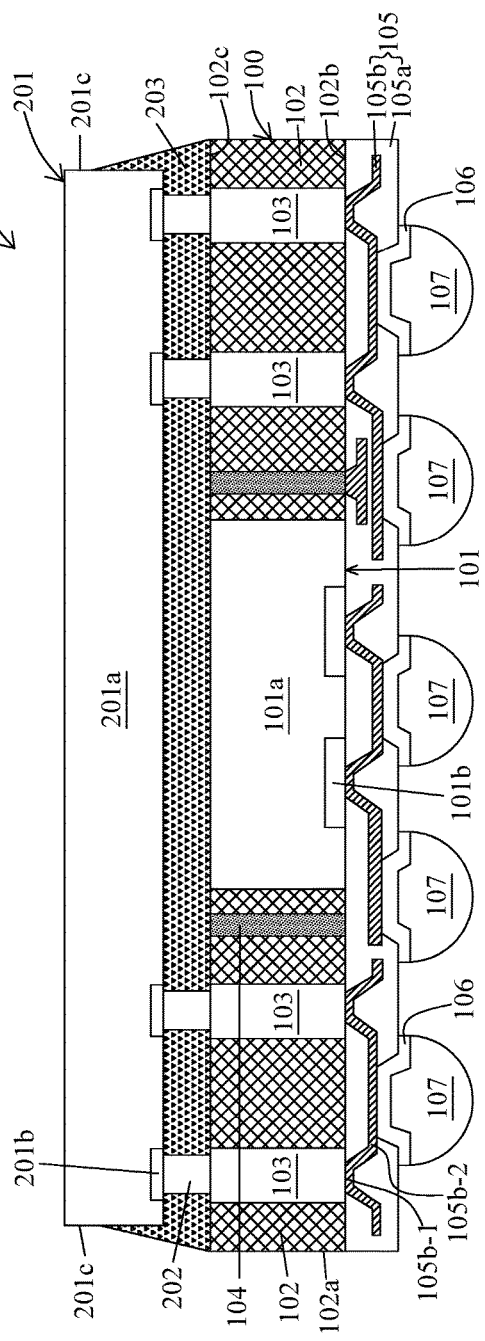

In some embodiments, an underfill 203 is disposed between the molding 102 and the second die 201a to surround the connector 202 as shown in FIG. 6L. In some embodiments, the underfill 203 fills gap between the second die 201, the molding 102 and the connector 202. In some embodiments, the underfill 203 is disposed by injection or any other suitable operations. In some embodiments, the underfill 203 has similar configuration as described above or illustrated in FIG. 5. In some embodiments, a semiconductor structure 200 is formed, which has similar configuration as described above or illustrated in FIG. 5.

In some embodiments, a circuit board is provided and the conductive bump 107 is bonded with the circuit board, such that the first die 101 and the second die 201 are electrically connected to the circuit board.

In the present disclosure, a semiconductor structure with improvement is disclosed. The semiconductor structure includes an elongated member disposed adjacent to a corner of a die and extending within a molding. The elongated member is configured to reduce a stress or warpage caused by CTE mismatch between the die and the molding. As a result, warpage or development of cracks can be minimized or prevented.

In some embodiments, a semiconductor structure includes a semiconductor structure includes a die, a molding interfacing with the die along a first direction, wherein a coefficient of thermal expansion (CTE) mismatch is between the molding and the die, a via extending within and through the molding, an elongated member extending within the molding and at least partially along the first direction, a conductive trace over the elongated member and the die, and a dielectric between the elongated member and the conductive trace, wherein the elongated member is proximal to the die than the via.

In some embodiments, a CTE of the molding is substantially greater than a CTE of the die. In some embodiments, the conductive trace partially overlaps the elongated member along a direction orthogonal to the first direction. In some embodiments, the conductive trace is electrically connected to the die. In some embodiments, the via extends along the first direction. In some embodiments, a distance between the die and the elongated member is about 50 um to about 300 um. In some embodiments, an area of a cross section of the elongated member along a direction orthogonal to the first direction is about 30,000 $um^2$ to about 500,000 $um^2$. In some embodiments, a cross section of the via along a direction orthogonal to the first direction is in a circular shape, and a cross section of the elongated member along the direction orthogonal to the first direction is in an L shape, a polygonal shape or in a mesh configuration. In some embodiments, the elongated member is configured to connect to an electrical ground.

In some embodiments, a semiconductor structure includes a first die, a molding encapsulating the first die and including a first surface and a second surface, a via extending within and through the molding, an elongated member extending within the molding and disposed between the first die and the via, a dielectric disposed over the first surface of the molding, a conductive trace disposed within the dielectric and electrically connected to the first die, the via or the elongated member, a second die disposed opposite to the second surface of the molding, and a connector disposed over the via to electrically connect the first die with the second die through the via, wherein the elongated member is electrically isolated from the second die and disposed proximal to the first die than the via.

In some embodiments, the elongated member is disposed adjacent to a corner of the first die. In some embodiments, the conductive trace connected to the elongated member is electrically isolated from the second die, or the conductive trace is electrically connected to the second die through the via. In some embodiments, an area of a cross section of the elongated member along a direction of the second surface is substantially greater than an area of a cross section of the via the direction of the second surface. In some embodiments, the via is disposed adjacent to a periphery of the second die. In some embodiments, a distance between the first die and the elongated member is substantially less than about 300 um, or a distance between the first die and the via is substantially greater than about 300 um. In some embodiments, the via is proximal to a sidewall of the molding orthogonal to the second surface, or the elongated member is distal to the sidewall of the molding. In some embodiments, a Young's modulus of the elongated member is substantially greater than a Young's modulus of the molding. In some embodiments, the elongated member includes copper, silicon, glass or ceramic.

In some embodiments, a method of manufacturing a semiconductor structure includes providing a substrate, disposing a die over the substrate, disposing a via over the substrate, disposing an elongated member over the substrate and between the die and the via, forming a molding over the substrate to encapsulate the die, the via and the elongated member, disposing a dielectric over the molding, forming a conductive trace within the dielectric, disposing a conductive bump over the conductive trace, and removing the substrate, wherein the elongated member is proximal to the die than the via.

In some embodiments, the elongated member is disposed and attached to the substrate by a die attach film (DAF).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure, comprising:
a first die;
a molding interfacing with the first die along a first direction, wherein a coefficient of thermal expansion (CTE) mismatch is between the molding and the first die;
a via extending within and through the molding;
an elongated member extending within the molding and at least partially along the first direction;
a conductive trace over the elongated member and the first die;
a dielectric between the elongated member and the conductive trace;
a second die disposed over the first die, the molding, the via and the elongated member; and
a connector disposed between and interfaced with the via and the second die,
wherein the elongated member is proximal to the first die than the via.

2. The semiconductor structure of claim 1, wherein a CTE of the molding is substantially greater than a CTE of the first die.

3. The semiconductor structure of claim 1, wherein the conductive trace partially overlaps the elongated member along a direction orthogonal to the first direction.

4. The semiconductor structure of claim 1, wherein the conductive trace is electrically connected to the first die.

5. The semiconductor structure of claim 1, wherein the via extends along the first direction.

6. The semiconductor structure of claim 1, wherein a distance between the first die and the elongated member is about 50 um to about 300 um.

7. The semiconductor structure of claim 1, wherein an area of a cross section of the elongated member along a direction orthogonal to the first direction is about 30,000 $um^2$ to about 500,000 $um^2$.

8. The semiconductor structure of claim 1, wherein a cross section of the via along a direction orthogonal to the first direction is in a circular shape, and a cross section of the elongated member along the direction orthogonal to the first direction is in an L shape, a polygonal shape or in a mesh configuration.

9. The semiconductor structure of claim 1, wherein the elongated member is configured to connect to an electrical ground.

10. A semiconductor structure, comprising:
a first die;
a molding encapsulating the first die and including a first surface and a second surface;
a via extending within and through the molding;
an elongated member extending within the molding and disposed between the first die and the via;
a dielectric disposed over the first surface of the molding;
a conductive trace disposed within the dielectric and electrically connected to the first die, the via or the elongated member;
a second die disposed opposite to the second surface of the molding;
a connector disposed over the via to electrically connect the first die with the second die through the via; and
an underfill disposed over the first die and the molding and surrounding the connector and a portion of the second die,
wherein the elongated member is electrically isolated from the second die and disposed proximal to the first die than the via.

11. The semiconductor structure of claim 10, wherein the elongated member is disposed adjacent to a corner of the first die.

12. The semiconductor structure of claim 10, wherein the conductive trace is connected to the elongated member, and the elongated member is electrically isolated from the second die.

13. The semiconductor structure of claim 10, wherein an area of a cross section of the elongated member along a direction of the second surface is substantially greater than an area of a cross section of the via along the direction of the second surface.

14. The semiconductor structure of claim 10, wherein the via is disposed adjacent to a periphery of the second die.

15. The semiconductor structure of claim 10, wherein a distance between the first die and the elongated member is substantially less than about 300 um, or a distance between the first die and the via is substantially greater than about 300 um.

16. The semiconductor structure of claim 10, wherein the via is proximal to a sidewall of the molding orthogonal to the second surface, or the elongated member is distal to the sidewall of the molding.

17. The semiconductor structure of claim 10, wherein a Young's modulus of the elongated member is substantially greater than a Young's modulus of the molding.

18. The semiconductor structure of claim 10, wherein the elongated member includes copper, silicon, glass or ceramic.

19. A method of manufacturing a semiconductor structure, comprising:
providing a substrate;
disposing a die over the substrate;
disposing a via over the substrate;
disposing an elongated member over the substrate and between the die and the via;
forming a molding over the substrate to encapsulate the die, the via and the elongated member;
disposing a dielectric over the molding;
forming a conductive trace within the dielectric;
disposing a conductive bump over the conductive trace;
disposing a second die over the molding and the first die;
disposing a connector between the second die and the via;
removing the substrate,
wherein the connector is interfaced with the second die and the via, the elongated member is proximal to the die than the via.

20. The method of claim 19, wherein the elongated member is disposed and attached to the substrate by a die attach film (DAF).

\* \* \* \* \*